United States Patent
Kwon (10) Patent No.: US 7,282,388 B2
(45) Date of Patent: Oct. 16, 2007

(54) METHOD OF MANUFACTURING WAFER LEVEL PACKAGE TYPE FBAR DEVICE

(75) Inventor: Jong Oh Kwon, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 717 days.

(21) Appl. No.: 10/755,336

(22) Filed: Jan. 13, 2004

(65) Prior Publication Data

US 2005/0056917 A1    Mar. 17, 2005

(30) Foreign Application Priority Data

Sep. 15, 2003   (KR) .................... 10-2003-0063556

(51) Int. Cl.
*H01L 21/16* (2006.01)
(52) U.S. Cl. ..................................... 438/106
(58) Field of Classification Search .............. 438/674, 438/106; 257/414
See application file for complete search history.

(56) References Cited

U.S. PATENT DOCUMENTS

| 6,407,649 | B1 | 6/2002 | Tikka et al. | |
| 6,762,471 | B2 * | 7/2004 | Kim | ............................ 257/414 |

FOREIGN PATENT DOCUMENTS

| JP | 09-172346 | | 6/1997 |
| JP | 10-270979 | A | 10/1998 |
| WO | 02/05425 | A1 | 1/2002 |
| WO | 02/058233 | A1 | 7/2002 |

OTHER PUBLICATIONS

Japanese Patent Office, Office Action mailed Jan. 9, 2007.

* cited by examiner

*Primary Examiner*—Carl Whitehead, Jr.
*Assistant Examiner*—Monica D. Harrison
(74) *Attorney, Agent, or Firm*—Lowe Hauptman Ham & Berner (57) ABSTRACT

In a method for manufacturing an FBAR device, the device includes a substrate having a certain size, at least one device functional portion performing a resonance function by responding to electrical signals applied from the outside, the device functional portion being formed along a center portion of the substrate while defining a certain air gap therein, plural external electrodes formed on an upper surface of the substrate substantially coming into contact with both opposite edges of the upper surface, the external electrodes being electrically connected to the device functional portion, and a cap bonded onto the substrate so as to function as a cover for covering a remaining portion of the substrate except for the plural external electrodes.

5 Claims, 6 Drawing Sheets

PROIR ART
FIG. 2A

PROIR ART
FIG. 2B

METHOD OF MANUFACTURING WAFER LEVEL PACKAGE TYPE FBAR DEVICE

BACKGROUND OF THE INVENTION

1. Field of the Invention

The present invention relates to a film bulk acoustic resonator (hereinafter, referred to as an FBAR), and more particularly to a method for manufacturing a wafer level package type FBAR device, which can achieve miniaturization and reduction of a manufacturing cost due to a simplified process.

2. Description of the Related Art

In recent years, wireless communication devices have tended to become much leaner, and enhanced and diversified in their quality and functions due to the development of the communication industry. This recent trend sincerely requires miniaturization and enhancement in quality related with various elements for use in the wireless communication devices. Nowadays, therefore, chip shaped elements have become increasingly commercialized.

The wireless communication devices essentially utilize a voltage controlled oscillator (VCO), a filter, a duplexer and other devices, and these devices basically contain at least one resonator. Such a resonator is used to induce a resonance effect due to the piezoelectric effect thereof. Currently, active development is targeting an FBAR, which is preferable for integration due to its thin film shape, and has good properties.

Typically, the FBAR is formed on a wafer with a piezoelectric layer through a vapor deposition and the like. At the upper and lower surfaces of the piezoelectric layer are provided upper and lower electrodes, respectively, for applying electricity to the piezoelectric layer so as to oscillate it. In addition to the upper and lower electrodes, a desired air gap is formed at the lower surface of the piezoelectric layer in order to improve a resonance property of the piezoelectric layer. The formed piezoelectric layer and upper and lower electrodes are packaged for the purpose of protection. In this case, a wafer level package (hereinafter, referred to as a WLP) technique may be adopted in order to facilitate mass production and achieve miniaturization due to a simplified packaging process. The WLP technique achieve the manufacture and packaging of the device simultaneously by bonding a cap wafer serving as an upper package, a lower package, and a substrate wafer to one another. The substrate performs a function of a device. FBAR devices manufactured by the WLP technique accompany increases of the number and function of external terminals provided at the outside due to the diversification of their functions, but also accompany a reduction in the size of the package thereof. This makes it difficult to design the shape, size and position of the external terminals.

FIGS. 1A and 1B and 2A and 2B illustrate different structures of conventional FBARs manufactured in accordance with a WLP technique, respectively.

Figure 1A:
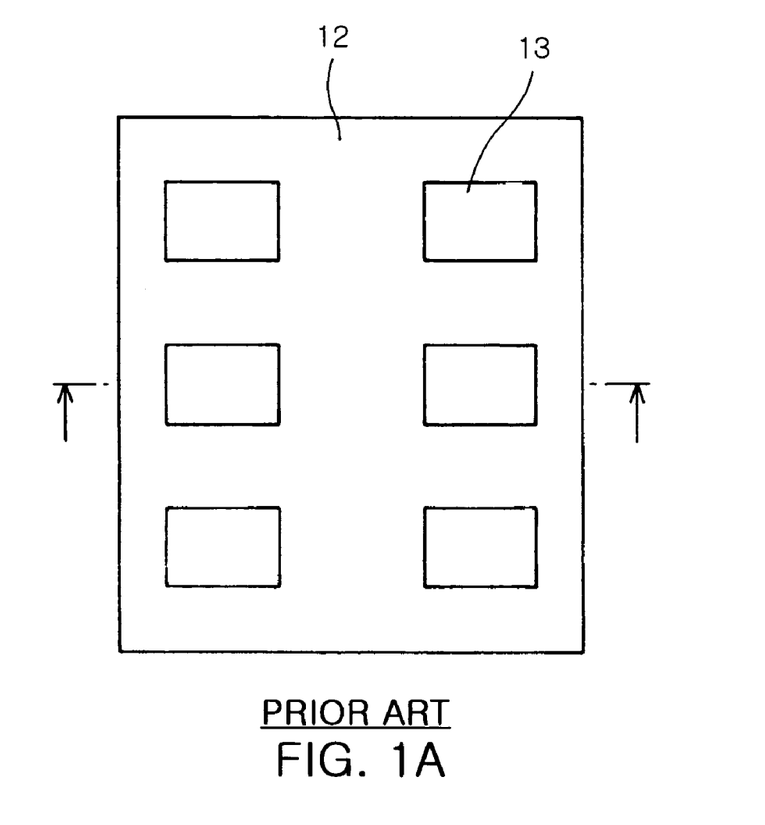
FIGS. 1A and 1B are a plan view and a sectional view, respectively, illustrating a wafer level package type FBAR device in accordance with the prior art.
Figure 1B:
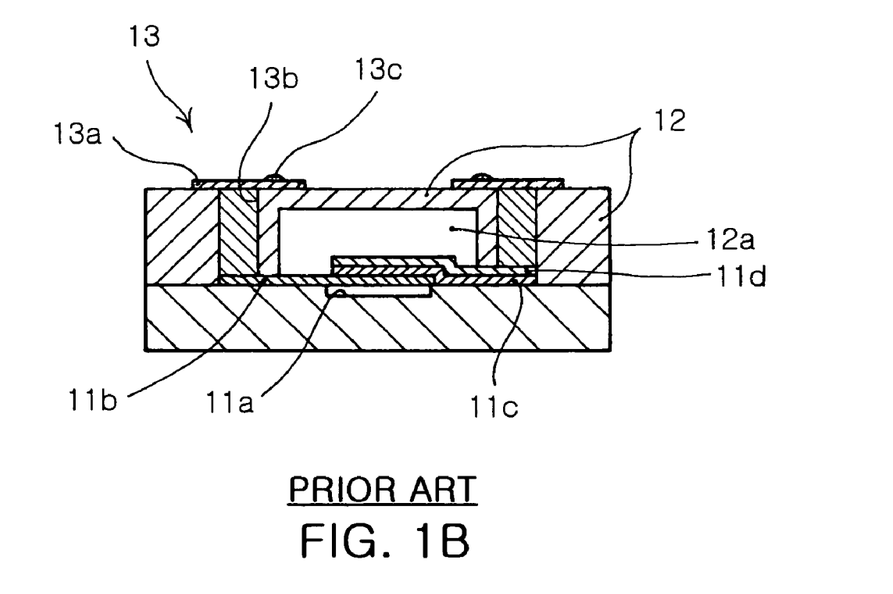

Referring to FIGS. 1A and 1B, one of the conventional FBARs comprises a substrate 11, and a cap 12 disposed on the substrate 11. The substrate 11 is formed with an air gap 11a, a lower electrode 11b, a piezoelectric layer 11c, and an upper electrode lid. The cap 12, made of a wafer, is formed with an empty cavity 12a at a portion where a circuit element is located. The cap 12 is further formed with perforated bores at positions corresponding to the upper and lower electrodes lid and 11b. After bonding the cap 12 to the substrate 11, the perforated bores are filled with a printing metal material, and external electrodes 13 are printed onto the upper surface of the cap 12 through a printing technique so that the external electrodes 13 are electrically connected to the upper and lower electrodes lid and 11b on the substrate 11.

In this case, the formation of the external electrodes 13 requires a printing process of metal electrodes for use as the external electrodes. Further, since the perforated bores have to be formed in the cap 12 in order to achieve electrical connection between the external electrodes 13 and the upper and lower electrodes lid and 11b on the substrate 11, there is a considerable limitation in design of a cap wafer.

Figure 2A:
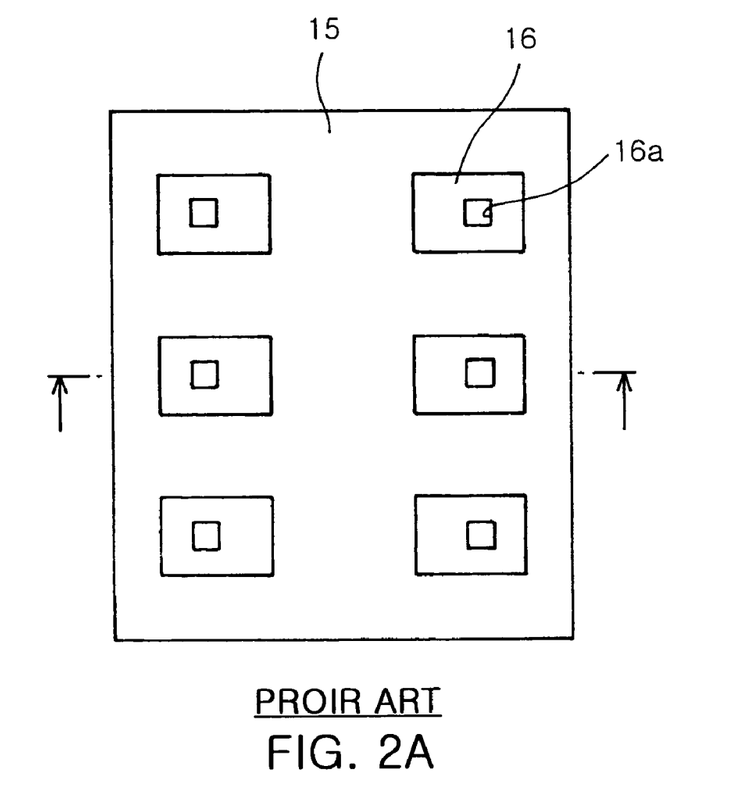
FIGS. 2A and 2B are a plan view and a sectional view, respectively, illustrating another wafer level package type FBAR device in accordance with the prior art.
Figure 2B:
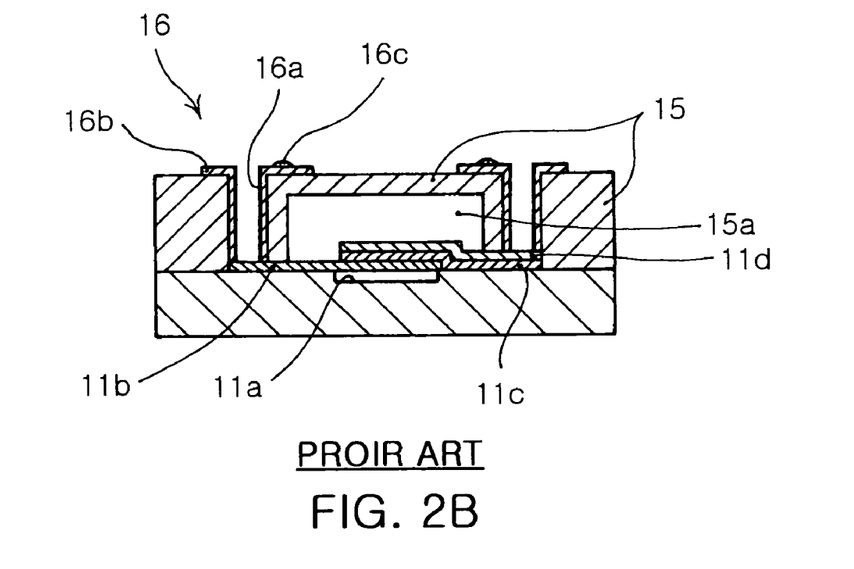

Referring to FIGS. 2A and 2B, the other conventional FBAR, which is similar in its basic configuration to that shown in FIG. 1A, comprises the substrate 11, and a cap 15 disposed on the substrate 11. The substrate 11 is formed with the air gap 11a, the lower electrode 11b, the piezoelectric layer 11c, and the upper electrode lid. The cap 15, made of a wafer, is formed with an empty cavity 15a at a portion where a circuit element is located, and further formed with perforated bores 16a at positions corresponding to the upper and lower electrodes lid and 11b. After bonding the cap 15 to the substrate 11, instead of filling a printing metal material into the perforated bores 16a, metal films are formed on the inner surfaces of the perforated bores 16a and on certain portions of the upper surface of the cap 15 adjacent to the perforated bores 16a by performing a metal deposition process in a state wherein the remaining portion of the upper surface of the cap 15, except for certain portions for forming external electrodes 16, is shield by the use of a mask made of a photoresist (PR), metal or glass materials. In this way, the upper and lower electrodes lid and 11b on the substrate 11 are electrically connected with the external electrodes 16, respectively.

In this case, similarly to the previously described case, the formation of the external electrodes 16 requires a perforated bore forming step and a metal deposition process, resulting in a considerable limitation in design of a cap wafer due to the perforated bores.

Although the structures of the conventional FBARs as stated above have been achieved according to most effective methods for miniaturization, due to the previously mentioned various processes including printing, metal deposition and formation of perforated holes, the conventional FBARs requires a relative complex process and have considerable limitations in design of the FBARs. This makes it difficult to secure a profit margin required for mass production and results in a high manufacturing cost.

In addition to the above problems, when it is desired to increase the number of external terminals in existing commercialized products, a photolithography technique has to be applied thus resulting in a further increase of manufacturing costs.

SUMMARY OF THE INVENTION

Therefore, the present invention has been made in view of the above problems, and it is an object of the present invention to provide a method for manufacturing a wafer level package type FBAR device, which can achieve miniaturization and reduction of a manufacturing cost due to a simplified process.

In accordance with one aspect of the present invention, the above and other objects can be accomplished by the provision of a wafer level package type film bulk acoustic resonator. (FBAR) device comprising: a substrate having a certain size; at least one device functional portion performing a resonance function by responding to electrical signals applied from the outside, the device functional portion being formed along a center portion of the substrate while defining a certain air gap therein; plural external electrodes formed on an upper surface of the substrate substantially coming into contact with both opposite edges of the upper surface, the external electrodes being electrically connected to the device functional portion; and a cap bonded onto the substrate so as to function as a cover for covering a remaining portion of the substrate except for the plural external electrodes.

Preferably, the device functional portion may include a piezoelectric layer coming into contact with the substrate through the air gap, and plural internal electrodes formed to come into contact with the piezoelectric layer for performing electrical signal input and output functions and a grounding function thereof.

Preferably, the substrate and the cap may be bonded to each other by means of an insulation intermediate including an insulation adhesive material and glass frit.

Preferably, the cap may include a cavity having a certain size, the cavity being formed at a lower surface of the cap so as to contain the device functional portion, and recesses formed at both lateral edges of the cavity for exposing the plural external electrodes to the outside.

Preferably, the plural external electrodes may be electrically connected to the plural internal electrodes of the device functional portion, and more preferably, the plural external electrodes may be integrally formed with the plural internal electrodes corresponding thereto.

In accordance with another aspect of the present invention, there is provided a method for manufacturing a wafer level package type FBAR device, the FBAR device having a substrate formed with plural external electrodes, comprising the steps of: a) forming plural device functional portions on a first wafer at certain distances; b) forming plural external electrodes between the adjacent device functional portions on the first wafer so as to be electrically connected with the adjacent device functional portions, each having a certain transversal length on the basis of a center point between the adjacent device functional portions; c) forming plural cavities at certain distances on a second wafer so as to correspond to the device functional portions of the first wafer, respectively; d) forming plural vertical perforations on the second wafer, each having a certain transverse length on the basis of a center point between the adjacent cavities; e) bonding an upper surface of the first wafer to a lower surface of the second wafer so that the plural cavities vertically face against the plural device functional portions, respectively, and the plural perforations vertically face against the plural external electrodes, respectively; and f) cutting the first and second wafers bonded to each other along center axes of the perforations.

Preferably, the step a) may include the steps of: a-1) dividing the first wafer having the certain size into plural sections by at least one set of vertical and horizontal lines, and simultaneously forming a sacrificial layer having a certain area on every section for achieving an acoustic reflection region; a-2) forming plural lower electrodes by applying a conductive material onto the sacrificial layer of every section; a-3) forming a piezoelectric layer on every section by applying a piezoelectric material onto the first wafer and onto the lower electrodes, respectively; a-4) forming plural upper electrodes by applying a conductive material onto the piezoelectric layer of every section; and a-5) forming air gaps by removing the sacrificial layer of every section, the air gap achieving an acoustic reflectance.

Preferably, the step e) may be performed to bond the first and second wafers to each other by the use of an insulation intermediate including an insulation adhesive material and glass frit.

Preferably, the external electrodes corresponding to the upper and lower electrodes may be simultaneously formed during formation of the upper and lower electrodes, and more preferably, the upper and lower electrodes may be integrally formed with the corresponding external electrodes.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, the manufacturing method and structure of an FBAR device according to the present invention will be described, with reference to the accompanying drawings.

Figure 3A:
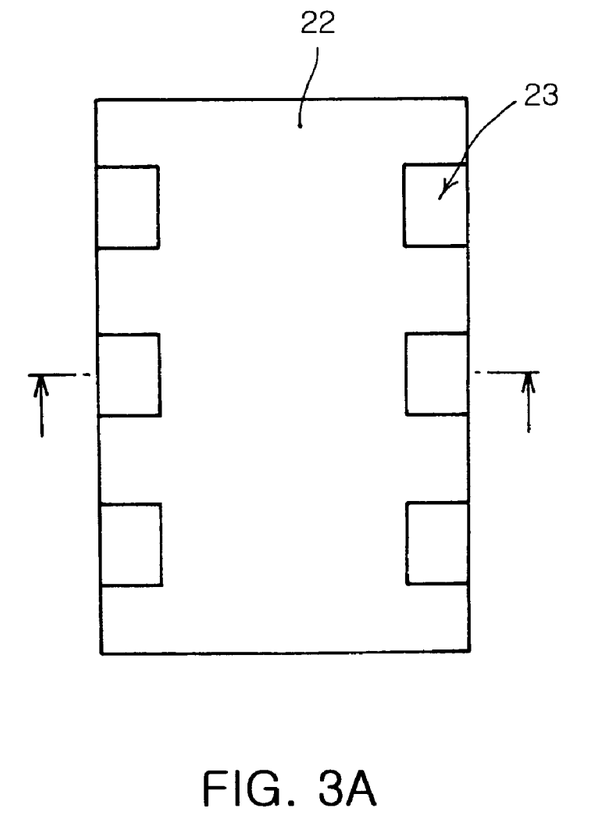
FIGS. 3A and 3B are a plan view and a sectional view, respectively, illustrating a wafer level package type FBAR device in accordance with the present invention.
Figure 3B:
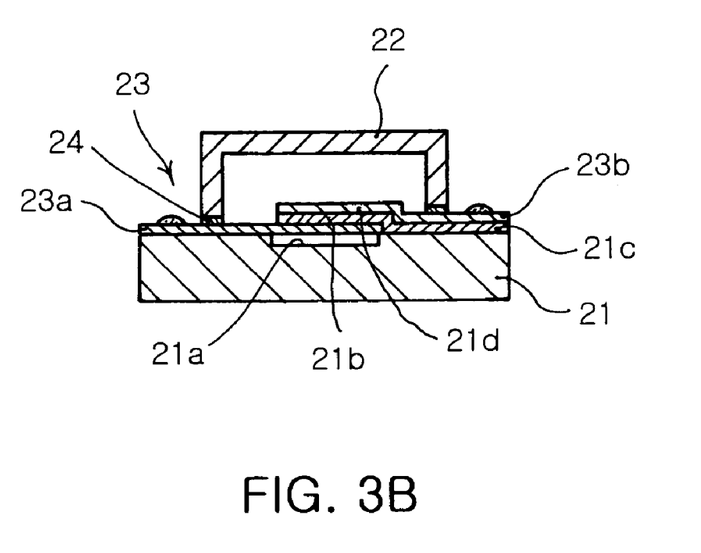

FIGS. 3A and 3B are a plan view and a sectional view, respectively, illustrating the structure of an FBAR device in accordance with the present invention. As shown in FIGS. 3A and 3B, the FBAR device basically comprises a substrate 21, at least one device functional portion formed at the upper surface of the substrate 21, plural external electrodes 23, 23a and 23b, and a cap 22. The device functional portion includes an air gap 21a, a lower electrode 21b, a piezoelectric layer 21c, and an upper electrode 21d, and causes a resonance effect. The external electrodes 23, 23a and 23b are arranged substantially coming into contact with both opposite edges of the upper surface of the substrate 21, and electrically connected to the lower and upper electrodes 21b or 21d of the device functional portion, respectively, for performing electrical signal input and output functions and a grounding function thereof. The cap 22 is bonded onto the substrate 21 by the use of an adhesive material 24, and adapted to seal and protect the device functional portion, namely, the air gap 21a, lower electrode 21b, piezoelectric layer 21c, and upper electrode 21d, except for the plurality of the external electrodes 23, 23a and 23b.

Considering the formation process of the device functional portion, for example, a sacrificial layer (not shown) is first disposed on the substrate 21, and then the lower electrode 21b, piezoelectric layer 21c and upper electrode 21d are formed in order on the sacrificial layer, and finally the air gap 21a, functioning as an acoustic reflection layer, is formed by removing the sacrificial layer. The device functional portion can be manufactured by using any other known processes instead of the above process, and the structure thereof is variable.

The external electrodes 23, 23a and 23b are formed at the same plane as the lower and upper electrodes 21b and 21d on the substrate 21, and electrically connected to the corresponding lower and upper electrodes 21b and 21d, respectively. In this case, it is preferable that the external electrodes 23, 23a and 23b are integrally formed to the corresponding upper and lower electrodes of the device functional portion.

The cap 22 is obtained by the use of a micro-electromechanical system (MEMS). The cap is formed at the lower surface thereof with a cavity having a certain size by using an etching or sanding process, and at both lateral edges of the cavity are formed recesses at portions which correspond to the external electrodes 23, 23a and 23b. According to this configuration, the cap is adapted to cover the remaining portion of the substrate 21 except for the external electrodes 23, 23a and 23b.

Although the present embodiment comprises six external electrodes 23, 23a and 23b as shown in FIG. 3A, the number of the external electrodes 23, 23a and 23b can be increased or decreased as necessary.

As stated above, the cap 22 is bonded to the substrate 21 by the use of the adhesive material 24. In case of such bonding, a part of the cap 22 to be bonded to the substrate 22 may come into contact with electrode patterns, namely, the external and internal electrodes for the input and output of electrical signals. Therefore, in order to achieve the normal operation of the FBAR device, it is preferred that the cap 22 is bonded to the substrate 21 by means of an insulation intermediate, such as an epoxy, liquid crystal polymer (LCP), a glass frit, or other insulation materials.

Figure 4:
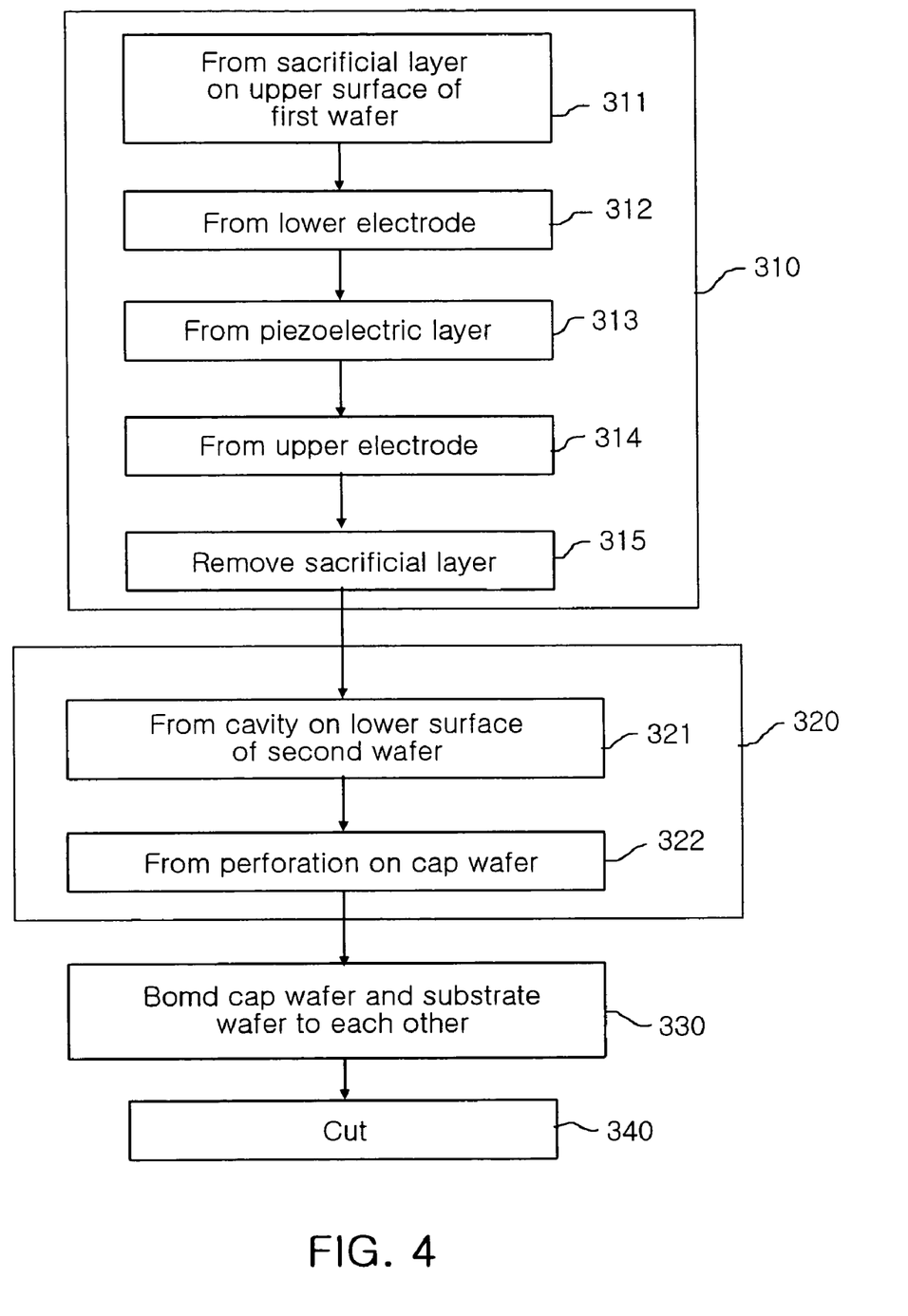
FIG. 4 is a flow chart illustrating a method for manufacturing the wafer level package type FBAR device in accordance with the present invention.

FIG. 4 is a flow chart illustrating a method for manufacturing the FBAR device according to the present invention. FIGS. 5A to 5D are sectional views, respectively, illustrating the sequential steps of the manufacturing method of the FBAR device. Now, the manufacturing method of the FBAR device according to the present invention will be described with reference to FIGS. 4 and 5A to 5D.

The device functional portion, namely, the air gap, lower electrode, piezoelectric layer and upper electrode for performing a resonance function, is formed at a first wafer (step 310). Considering the step 310 in detail, the first wafer is first divided into a plurality of substrate sections by the use of vertical and horizontal lines, and every substrate section is formed with a separate sacrificial layer, respectively (step 311). The lower electrode of the device functional portion is formed on the first wafer and consequently on the sacrificial layer so as to extend to a boundary line between the adjacent substrate sections, thereby allowing external electrodes, which will be bonded, to be simultaneously formed along with the formation of the lower electrode (step 312). Subsequently, the piezoelectric layer is formed on the lower electrode and on the sacrificial layer (step 313), and then the upper electrode is formed on the piezoelectric layer (step 314). Similarly to the formation of the lower electrode, the upper electrode is formed so as to extend to a boundary line between the adjacent substrate sections, thereby allowing external electrodes, which will be bonded, to be simultaneously formed along with the formation of the upper electrode. Finally, a fine bore is vertically perforated to the sacrificial layer so as to remove the sacrificial layer by injecting etching solution or etching gas there through, thereby forming an air gap (step 315). Through the steps as described above, the device functional portion having a resonance function is formed so as to oscillate by electrical signals applied from the outside.

The formation process of the device functional portion onto the substrate as stated above is not limited thereto, and may be formed according to other known processes or structures. In the present invention, however, the external electrodes corresponding to the upper and lower electrodes of the device functional portion are formed simultaneously with the formation of the upper and lower electrodes so that they are integrally formed at the same plane as the upper and lower electrodes and electrically connected thereto. In this case, the external electrodes are positioned on the boundary lines between the adjacent substrate sections obtained by vertically and horizontally dividing the first wafer. The boundary lines serve as cutting lines for a following cutting process, namely, they become the edges of respective devices.

The step 310 of processing the first wafer for use as a substrate may be performed simultaneously with or before a step 320 of processing a second wafer, which is used as a cap as will be described hereinafter, but the first wafer processing step 310 as well as the second wafer processing step 320 have to be completed before bonding the first wafer to the second wafer, as will be described hereinafter.

Considering the step 320 of processing the second wafer for use as an upper cap, as shown in FIG. 5, a plurality of cavities 44 are formed at the lower surface of the second wafer, designated as reference numeral 42, having a certain thickness. The cavities 44 are spaced apart from each other by certain distances. For this, the second wafer 42 is first divided into a plurality of cap sections by the use of vertical and horizontal lines, and every cap section is formed at the lower surface with a protective mask pattern 43 so as to cover the remaining portion of the lower surface except for the center portion, thereby allowing one of the cavities 44 having a certain size and depth to be formed at the center portion of every cap section by using an etching or sanding process, respectively. The plurality of cap sections, constituting the second wafer 42, corresponds to the devices of the first wafer, respectively.

Figure 5A:
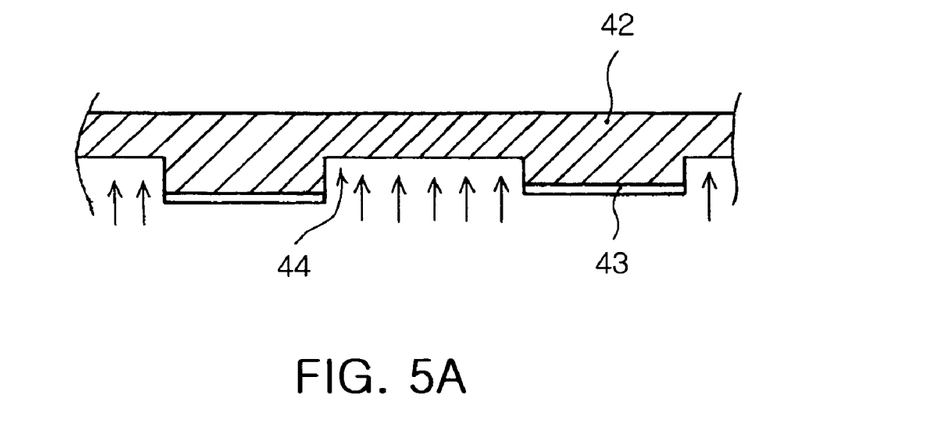
FIGS. 5A to 5D are sectional views, respectively, illustrating the sequential steps of manufacturing the wafer level package type FBAR device in accordance with the present invention.
Figure 5B:
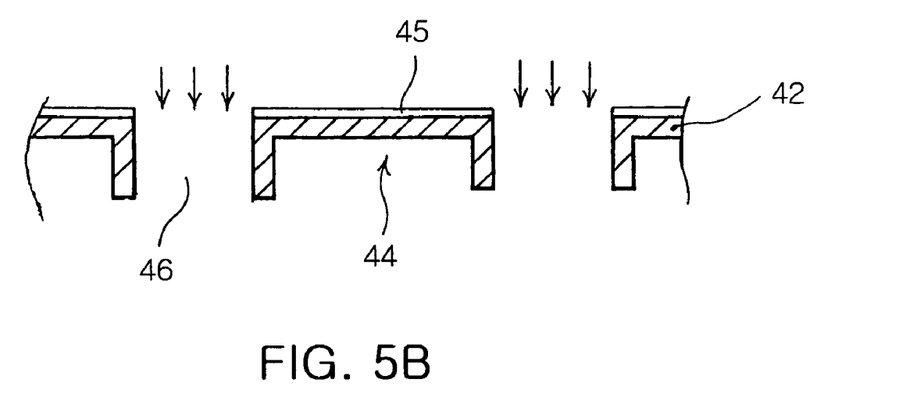

After completing the formation of the cavities 44, as shown in FIG. 5B, a plurality of vertical perforations 46 having a certain size are formed between the adjacent cavities 44 of the second wafer 42 by wholly removing portions between the cavities 44. Each of the vertical perforations 46 has a certain transversal length on the basis of the center point between the adjacent cavities 44. In this case, the perforations 46 are positioned on the cutting lines, which divide the respective device sections, respectively.

Similarly to the formation of the cavities 44 as described above, the upper surface (or the lower surface) of the second wafer 42 is formed with a mask pattern 45 so as to cover the remaining portion of the upper surface except for certain portions where the perforations 46 are to be formed, thereby allowing the perforations 46 to be vertically formed so as to extend down to the lower surface by using an etching or sanding process. By removing the mask pattern 45, the formation of the perforations 46 is completed.

The cross-sectional shape of the perforations 46 may be freely selected from among square and circular shapes, so long as they have an area for securing a smooth bonding process.

Figure 5C:
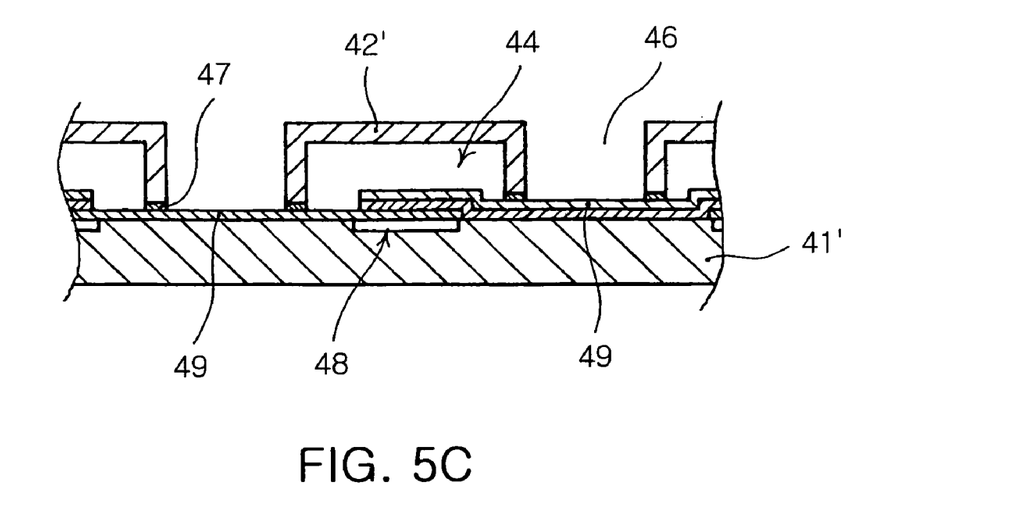

After completion of the above processes, the processed substrate wafer and cap wafer are bonded to each other by the use of an adhesive material, which is made of an insulating material (step 330). FIG. 5C is a sectional view illustrating the substrate wafer, designated as reference numeral 411, and the cap wafer, designated as reference numeral 42', which are bonded to each other by the above step 330. As shown in FIG. 5C, the substrate wafer 41' and the cap wafer 42' are bonded to each other so that each cavity 44 of the cap wafer 42' faces against the device functional portion, namely, the piezoelectric layer, air gap, and upper and lower electrodes, of the substrate wafer 41', and the perforations 46 of the cap wafer 42' face against the electrode patterns on the substrate wafer 41'. Therefore, each cavity 44 has an area sufficient to cover at least one device functional portion formed at the substrate wafer 41'.

The substrate wafer 41' and the cap wafer 42' bonded to each other are cut along the cutting lines through a dicing process, thereby obtaining individual devices 50 (step 340). Here, the cutting lines coincide with extension lines along center axes of the perforations 46 formed at the step 322, respectively.

Figure 5D:
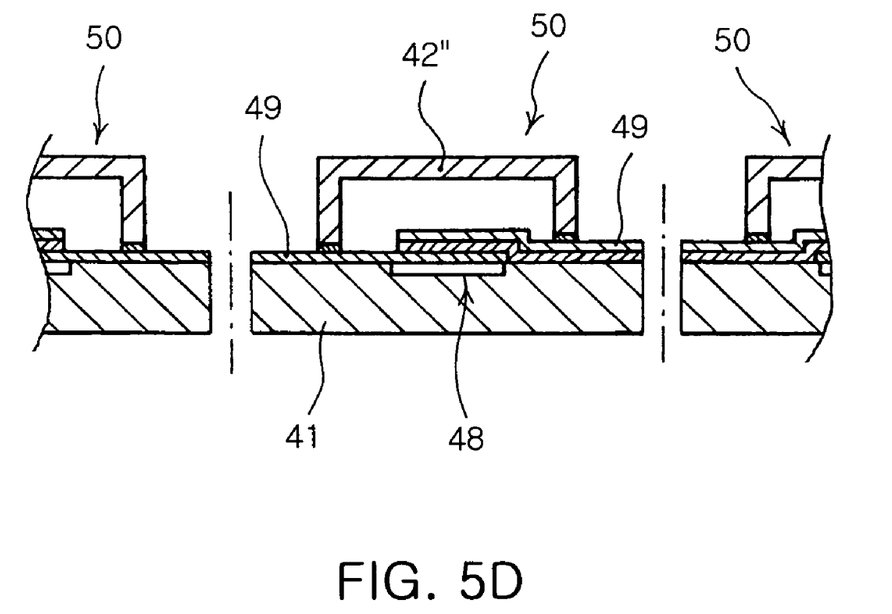

The cross-sectional shape of each device manufactured according to the above method is shown in FIG. 5D.

Referring to FIG. 5D, as the substrate wafer 41' is cut by a dicing process along the cutting lines corresponding to the extension lines of the perforations 46 so as to obtain individual devices 50, each device 50 is formed with external electrodes 49 substantially coming into contact with both opposite edges of the upper surface of the substrate. At both lateral portions of an obtained cap 42" are formed recesses corresponding to the external electrodes 49, thereby allowing the external electrodes 49 to be exposed to the outside.

In case of the FBAR device according to the present invention, therefore, a metal deposition or printing process for the formation of separate external electrodes is not required.

Figure 6:
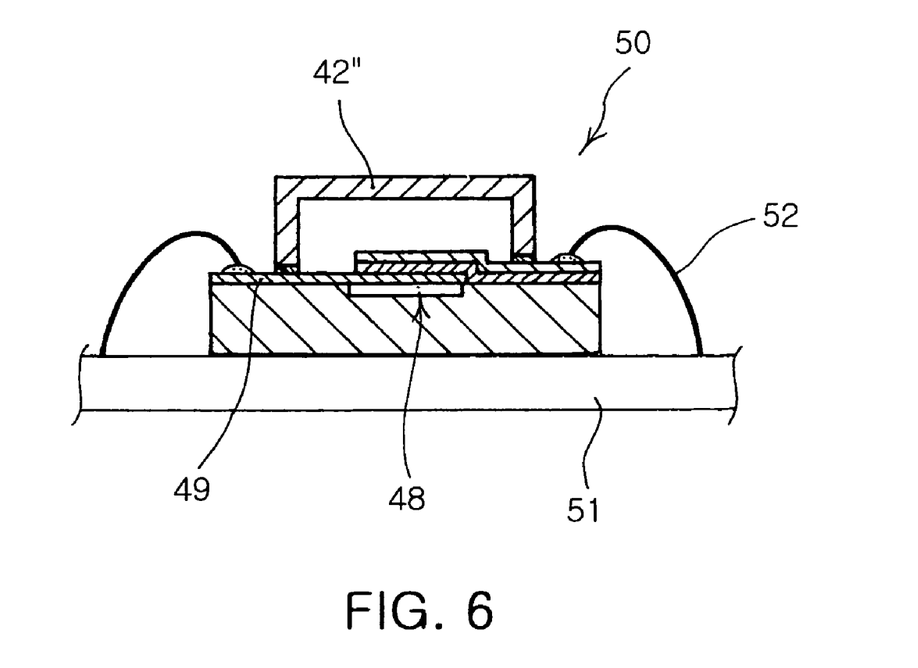
FIG. 6 is a sectional view illustrating the manufactured FBAR device mounted to a board in accordance with the present invention.

When it is desired to mount the FBAR device manufactured according to the above method to a board 51, as shown in FIG. 6, the device 50 is mounted on the board 51 by using a die-bonding process. The external electrodes 49, which are formed on the substrate of the device 50 so as to be exposed to the outside without being covered by the cap 42", are bonded wires, respectively. The wire-bonded external electrodes 49 have the same height as the electrodes constituting the device functional portion, designated as reference numeral 48, respectively.

The device may be mounted by forming bump balls having a size corresponding to the electrodes 49, and performing a flip bonding so that a location portion of a chip driving unit faces the board.

When compared with the conventional FBAR device shown in FIGS. 1A and 1B and 2A and 2B, the conventional FBAR device has a wire bonding position at the upper surface of the obtained package, but the FBAR device of the present invention has a wire bonding position at the upper surface of the substrate wafer. Therefore, the wire bonding position can be considerably lowered according to the present invention, resulting in a reduction in the thickness of the FBAR device.

As apparent from the above description, the present invention provides a method for manufacturing an FBAR device obtained by using a WLP technique, which utilizes internal electrode patterns provided on a substrate as external electrode patterns without separately processing the external electrodes, resulting in a reduction in investment and manufacturing costs in case of mass production thus assuring competitiveness of the products. Further, according to the present invention, by virtue of omission of printing, metal deposition or other processes conventionally required for the formation of the external electrodes, it is possible to completely eliminate short circuits due to dust generated from the above processes or during filing. Furthermore, according to the present invention, since a wire bonding position is lowered from the surface of a cap wafer to the surface of a substrate wafer, it is possible to achieve a reduction in the thickness as large as several tens to hundreds of micrometers when it is mounted to a certain set.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a wafer level package type FBAR device, the FBAR device having a substrate formed with plural external electrodes, comprising the steps of:
   a) forming plural device functional portions on a first wafer at certain distances;
   b) forming plural external electrodes between the adjacent device functional portions on the first wafer so as to be electrically connected with the adjacent device functional portions, each having a certain transversal length on the basis of a center point between the adjacent device functional portions;
   c) forming plural cavities at certain distances on a second wafer so as to correspond to the device functional portions of the first wafer, respectively;
   d) forming plural vertical perforations on the second wafer, each having a certain transverse length on the basis of a center point between the adjacent cavities;
   e) bonding an upper surface of the first wafer to a lower surface of the second wafer so that the plural cavities vertically face against the plural device functional portions, respectively, and the plural perforations vertically face against the plural external electrodes, respectively; and
   f) cutting the first and second wafers bonded to each other along center axes of the perforations.

2. The method as set forth in claim 1, wherein the step a) includes the steps of:
   a-1) dividing the first wafer having the certain size into plural sections by at least one set of vertical and horizontal lines, and simultaneously forming a sacrificial layer having a certain area on every section for achieving an acoustic reflection region;
   a-2) forming plural lower electrodes by applying a conductive material onto the sacrificial layer of every section;
   a-3) forming a piezoelectric layer on every section by applying a piezoelectric material onto the first wafer and onto the lower electrodes, respectively;
   a-4) forming plural upper electrodes by applying a conductive material onto the piezoelectric layer of every section; and
   a-5) forming air gaps by removing the sacrificial layer of every section, the air gap achieving an acoustic reflectance.

3. The method as set forth in claim 1, wherein the step e) is performed to bond the first and second wafers to each other by the use of an insulation intermediate including an insulation adhesive material and glass fit.

4. The method as set forth in claim 2, wherein the external electrodes corresponding to the upper and lower electrodes are simultaneously formed during formation of the upper and lower electrodes.

5. The method as set forth in claim 2, wherein the upper and lower electrodes are integrally formed with the corresponding external electrodes.

* * * * *